United States Patent [19]

Williamson, III

[11] Patent Number: 5,701,352

[45] Date of Patent: Dec. 23, 1997

[54] TONE SUPPRESSION AUTOMATIC GAIN CONTROL FOR A HEADSET

[75] Inventor: William A. Williamson, III, Stone Mountain, Ga.

[73] Assignee: BellSouth Corporation, Atlanta, Ga.

[21] Appl. No.: 274,832

[22] Filed: Jul. 14, 1994

[51] Int. Cl.[6] .............................. H04R 1/00; H03G 9/00; H03G 3/00
[52] U.S. Cl. ............................... 381/104; 381/94
[58] Field of Search .................... 381/104, 107, 381/108, 110, 94, 56; 455/219, 220, 221, 222

[56] References Cited

U.S. PATENT DOCUMENTS

| | | | |
|---|---|---|---|
| 3,631,365 | 12/1971 | Dolby | 333/14 |
| 3,751,602 | 8/1973 | Breeden | 179/81 B |
| 3,763,324 | 10/1973 | Garcia et al. | 179/1 VE |
| 3,967,064 | 6/1976 | Sigworth | 179/1 P |
| 3,991,272 | 11/1976 | Tarr | 179/1 VL |
| 4,063,033 | 12/1977 | Harbert et al. | 179/1 P |
| 4,079,211 | 3/1978 | Janssen | 179/81 R |
| 4,185,168 | 1/1980 | Graupe et al. | 179/1 P |
| 4,224,470 | 9/1980 | Persson et al. | 179/1 VL |
| 4,301,330 | 11/1981 | Trump | 179/1 A |
| 4,430,754 | 2/1984 | Ishigaki | 455/72 |
| 4,449,106 | 5/1984 | Ishigaki et al. | 333/14 |
| 4,453,258 | 6/1984 | Richardson | 375/98 |
| 4,457,020 | 6/1984 | King | 455/70 |
| 4,538,296 | 8/1985 | Short et al. | 381/72 |
| 4,578,648 | 3/1986 | Werrbach | 330/281 |
| 4,587,561 | 5/1986 | Kudo | 358/167 |
| 4,602,337 | 7/1986 | Cox | 364/480 |
| 4,677,678 | 6/1987 | McCutchen | 381/72 |
| 4,754,486 | 6/1988 | Stafford et al. | 381/86 |
| 4,783,819 | 11/1988 | DeKoning et al. | 381/83 |
| 4,835,484 | 5/1989 | Coulmance | 330/138 |
| 4,962,426 | 10/1990 | Naoi | 358/167 |
| 4,992,876 | 2/1991 | Nishizawa et al. | 358/43.1 |
| 5,371,803 | 12/1994 | Williamson, III | 381/104 |

FOREIGN PATENT DOCUMENTS

| | | | |
|---|---|---|---|
| 1228795 | 4/1971 | United Kingdom | H03G 7/00 |
| 2189953 | 11/1987 | United Kingdom | H03G 3/20 |

OTHER PUBLICATIONS

Lewkowicz et al. Automatic Gain Control With Equalizer; IBM Corp 1979 pp. 3569-3576.

Lewkowicz, J. and O'Day, R.L; Automatic Gain Control and Equalizer; IBM Technical Disclosure Bulletin; Feb. 1979, vol. 21, No. 9, pp. 3569-3570.

*Primary Examiner*—Thomas D. Lee
*Assistant Examiner*—Jerome Grant, II
*Attorney, Agent, or Firm*—Jones & Askew

[57] ABSTRACT

An improved automatic gain control circuit for a telephonic headset having a gain control stage in the audio signal path to attenuate tones, in which the gain is controlled by a control signal. A peak filter and an average filter generate signals proportional to the peak and average levels of the input signal, respectively. The signals are compared and a control signal is generated based on the relative signal levels. When the average signal exceeds a predetermined fraction of the peak signal, the circuit recognizes the signal as a tone and generates a control signal that causes the gain control stage to increase attenuation of the input signal.

37 Claims, 2 Drawing Sheets

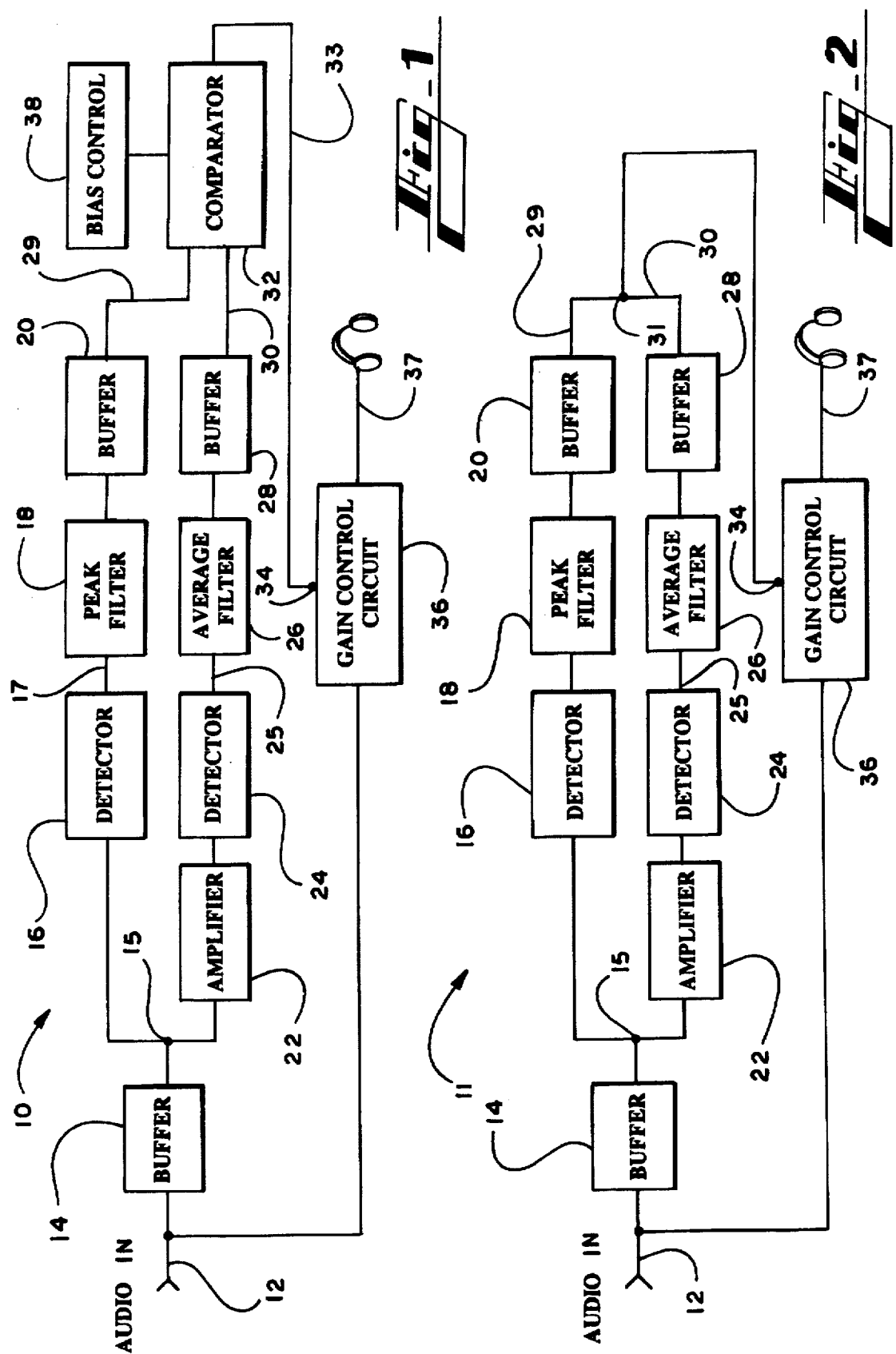

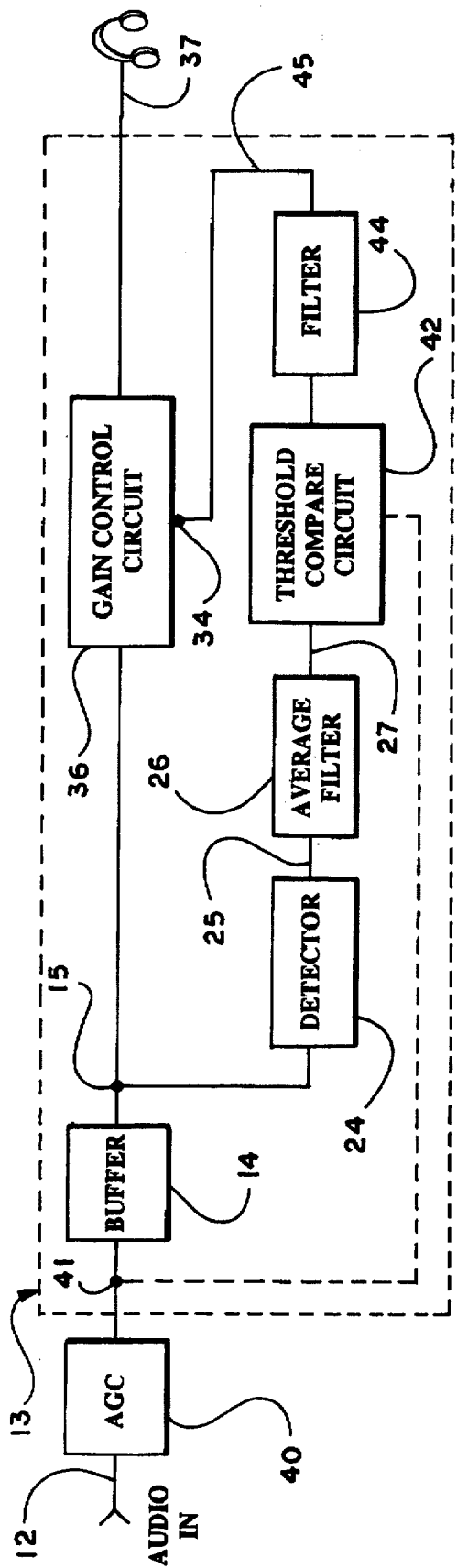
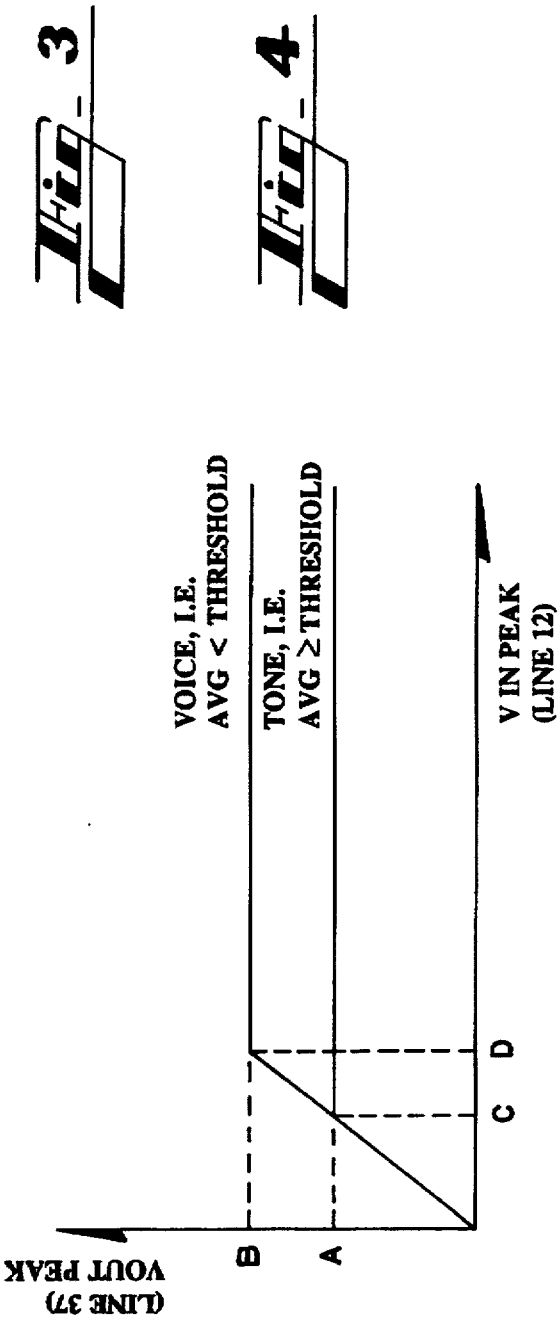

TONE SUPPRESSION AUTOMATIC GAIN CONTROL FOR A HEADSET

TECHNICAL FIELD

The present invention relates generally to apparatus for automatically varying the gain in an electronic circuit and in particular discloses a tone reduction circuit for use with a telephone headset.

BACKGROUND OF THE INVENTION

Headsets have long been used in conjunction with modern telephone equipment. Typically, headset users are ones whose jobs require either that they spend a substantial amount of time on the phone, or that their hands be free to perform other tasks. Examples of occupations where headsets are commonly used, include, among others, telephone operators, office receptionists, airline reservation clerks, stock brokers, customer service representatives, technical support and repair personnel, and police and fire department dispatchers.

The use of a headset provides many advantages. For example, a headset allows the user to perform other tasks while on the telephone. Examples of such tasks include taking messages, routing incoming calls, and using a computer terminal to enter or retrieve data. The use of a headset also reduces the amount of time required to answer an incoming call, thus making the headset user more efficient. In addition, the use of a headset eliminates the physical discomfort that can occur when a person talking on the telephone attempts to prop a regular telephone handset against his or her ear by tilting the head and raising the shoulder.

However, there are also disadvantages associated with the use of headsets. Since the headset's speaker is held in or against the user's ear, it is impossible to respond to any irritating tones or noises by moving the speaker closer to or further away from the ear as one typically does with a regular telephone handset.

Most tones originate from data sets, fax machines, and automatic dialers. In addition, "out of service" tones and "receiver off hook" tones are commonly encountered. Regarding standard telephone calls, when a calling party activates the dual tone multi-frequency (DTMF) (touch tone) keypad while his or her telephone station is connected to an operator wearing a headset, a touch tone signal having a level on the order of −3 dBm to 0 dBm can be generated on the telephone line at the operator's station.

It is well known that excessive noise causes fatigue and difficulty in concentration on one's work. This is particularly true if one experiences bursts of loud tones. Thus, a reduction in exposure to loud tones is desirable for both the comfort of employees wearing telephonic headsets and to prevent such employees from being unnecessarily fatigued and to meet the requirements of the Occupational Safety and Health Administration (OSHA).

There are existing headset control circuits which address this problem. The first type is a peak limiting circuit which suppresses extremely loud signals. A peak limiting device reduces the level of signals which exceed a predetermined level. Only those signals (voice or tones) which are extremely loud are attenuated by the peak limiter. This type of device prevents the headset user from suffering discomfort or injury which could be caused by excessively loud signals. However, this approach does not bring quiet, low level signals up to a volume level at which they may be clearly and comfortably understood by the headset user. Additionally, most limiting circuits are clipping devices and simply clip off the excursion of a signal past a particular threshold causing odd harmonic distortion which is known to have a harsh sound to the listener.

Existing control circuits that function to limit the increased peak signals do not work well to attenuate tones. For most voice signals, the peak signal level is much higher than the average level. Therefore, voice signals generally have high peak-to-average ratios. However, for a pure sinusoidal tone, the average signal level is much higher, such that the peak signal level is only slightly higher than the average level. Thus, tone signals have constant and small peak-to-average ratios. Because most existing control circuits operate to attenuate signals based only on their peak signal levels relative to a certain threshold, these existing circuits do not use the peak to average ratio of the signal as a factor in determining the level of attenuation to be applied to a signal. Existing circuits, therefore, allow signals with average levels that are high, yet have peak levels that do not exceed the threshold, to pass to the user's headset. Because humans tend to equate the average signal level with loudness, and since tone signals have higher average levels than corresponding voice signals, the user hears tones as being louder than voice signals which have similar peak levels.

Conventional automatic gain control (AGC) works in a well known manner to make the gain at a given stage of amplification a function that is inversely proportional to the signal level at a given point in the circuit. Most conventional AGC circuits simply feed back the output of a particular stage to provide a control signal which reduces the gain as the output increases. In most applications of AGC circuits to audio signal paths, the AGC is simply a form of negative feedback and is most commonly used to provide a non-linear (normally approximating logarithmic) signal level to gain characteristic.

It is well known in the art to use such an AGC circuit, together with some form of peak limiting or clipping arrangement, to prevent extremely loud sounds from making it through audio signal paths, particularly signal paths connected to headsets of telephone operators.

As is well known to those skilled in the art, automatic gain control circuits are devices which almost always respond to some form of integrated or average signal level. Those which respond very quickly may be thought of to be devices having very short integration times, and thus are circuits which average a very short time window of the signal level. Slower responding devices make the gain a function of the history of the signal over a longer most recent interval, i.e., they have a longer integration time. Those skilled in the art know that it is common to define and describe two characteristics of automatic gain control circuits known as attack time and release time. The attack time is the time period required after a sudden increase in the input signal amplitude for the gain of the AGC circuit to reach a predetermined percentage of the steady state change in gain it will make in response to continued application of the new input signal level. It may be likened to, and is often the equivalent of, a charging time constant for an R/C circuit. Similarly, release time is defined as a similar interval for the change in amplification which results from a sudden decrease in input signal level. Those skilled in the art know that many AGC circuits are designed so that they have differing attack and release times in order to achieve the desired goals of the AGC circuit without introducing an excessive amount of unpleasant distortion into the audio signal.

Therefore, there is a need in the art for an improved automatic gain control circuit for headsets which provides a comfortably audible signal over a rapidly changing range of inputs while attenuating tones. A need also exists for a circuit that recognizes the input signal as either voice or tone, and provides greater attenuation for tones than for corresponding voice signals.

SUMMARY OF THE INVENTION

The present invention provides an improved automatic gain control circuit for a headset. The circuit operates on the theory that the peak-to-average signal ratio for tones is constant and much smaller than the peak-to-average ratio for voice signals. Thus, the circuit determines when a tone is present by comparing the peak and average levels of the input signal. When a tone is not present, as when the input comprises a typical voice signal, the gain control circuit operates to attenuate the signal in an ordinary manner based on its peak level. When a tone is recognized, the circuit applies greater attenuation to the tone signal than would normally be applied to a voice signal having the same peak level.

The input signal is passed through a buffer and then fed, through a detector, to a peak filter, which generates a signal proportional to the peak value of the input signal. The buffered input signal is also fed to an average filter through an amplifier and a detector. The average filter generates a signal proportional to the average value of the input signal. Because the average signal is less than the peak signal for voice, the amplifier provides sufficient gain such that the output of the average filter is slightly less than the peak signal level when the input signal is voice. Consequently, the amplifier gain causes the average filter output to be greater than the peak filter output when the input signal is a tone.

The outputs of the peak and average filters are buffered and then input to a comparator, the output of which is used to provide a control signal to the control input of a gain control circuit. When the output of the average filter exceeds the output of the peak filter, which occurs during a tone, the comparator output is positive. A diode, responsive to the comparator output, passes this positive output to the control input of the gain control circuit, causing attenuation of the input signal to be controlled by the average signal level. Conversely, when the output of the average filter does not exceed the output of the peak filter, which occurs during voice, the comparator output is negative. The diode blocks this negative output and attenuation by the gain control circuit is controlled by the peak value of the input signal.

Thus, it is an object of the present invention to provide an improved automatic gain control circuit for a headset.

It is a further object of the present invention to provide an improved automatic gain control circuit to detect the presence of a tone applied to the input of the circuit.

It is another object of the present invention to provide an automatic gain control circuit to compare the peak and average levels of the input signal to determine the presence of a tone.

It is yet another object of the present invention to provide an improved automatic gain control circuit to provide attenuation that will respond to peak signal levels for signals with high peak-to-average ratios, and will respond to average signal levels for signals with low peak-to-average ratios.

It is a further object of the present invention to provide an automatic gain control circuit to attenuate tones so that the noise exposure of headset users is limited.

It is another object of the present invention to provide an automatic gain control circuit to output to the headset of the user signals of generally equal average levels, thereby preventing abrupt increases in the loudness perceived by the user.

It is a further object of the present invention to provide a method for detecting and attenuating audio input signals that are tones.

Other objects, features, and advantages of the present invention will become apparent upon reading the following specification, when taken in conjunction with the drawings and the appended claims.

BRIEF DESCRIPTION OF THE DRAWINGS

FIG. 1 is a block diagram of the preferred embodiment of an automatic tone attenuation circuit in accordance with the present invention.

FIG. 2 is a block diagram of another embodiment of an automatic tone attenuation circuit in accordance with the present invention.

FIG. 3 is a block diagram of another automatic tone attenuation circuit in accordance with the present invention.

FIG. 4 is a graphical representation of the output voltage against the input voltage, for the tone attenuation circuit of FIG. 3.

DETAILED DESCRIPTION OF THE DISCLOSED EMBODIMENT

Turning next to the drawing figures in which like numerals represent like parts, the preferred embodiment will now be described in detail.

FIG. 1 is a block diagram of the preferred embodiment of the tone attenuator circuit, generally shown at 10, which automatically attenuates signals identified as tones provided to a telephone headset. The audio input signal 12 is passed through an input buffer 14. Such an input buffer stage is well known to those skilled in the art and may be comprised of several different configurations. In the preferred embodiment, buffer 14 is an operational amplifier with its negative terminal connected to its output.

Audio input signal 12 is also provided to the input of a gain control circuit 36, the design of which is well known to those skilled in the art. Gain control circuit 36 attenuates input signal 12 before delivering it to output 37. The attenuation provided by gain control circuit 36 is controlled by a signal provided to its control input 34. In the preferred embodiment, the control input activates an FET type switch, which varies the value of a feedback resistor in an operational amplifier circuit to reduce the gain.

The buffered input signal 15 is supplied to a detector 16. Detector 16 preferably comprises a simple diode, but may be formed of several alternative configurations known in the art. The output of detector 16 is input to peak filter 18, which outputs a signal proportional to the peak level of the signal provided to its input on line 17. Peak filter 18 preferably includes a filter capacitor and a discharge resistor, both connected between its input on line 17 and ground. The values of the filter capacitor and the discharge resistor are such that the peak filter has a fast attack time and has a discharge time of 0.5 to 5 seconds. The output of peak filter 18 is passed to buffer 20, which is preferably a typical operational amplifier buffer with its negative terminal connected to its output terminal and an isolation resistor connected to its output.

The buffered input signal on line 15 is also supplied to an amplifier 22. The output of amplifier 22 is supplied to detector 24, which is identical to detector 16, and preferably comprises a diode. The output, on line 25, of detector 24 is input to average filter 26, which outputs a signal proportional to the average level of the signal provided to its input on line 25. Average filter 26 preferably includes a resistor in series with the input on line 25 and a filter capacitor and a discharge resistor, both connected between the output of the series resistor and ground. The values of filter capacitor and discharge resistor are equal to the values of similar components in the peak filter. The value of the series resistor is chosen such that the time constant of the series resistor and filter capacitor is from 0.1 to 0.4 seconds. The output of average filter 26 is supplied to buffer 28, which is also a typical operational amplifier buffer with its negative terminal connected to its output terminal and an isolation resistor connected to its output.

The outputs, on lines 29 and 30, of buffers 20 and 28, respectively, are connected to the input terminals of comparator 32. Comparator 32 preferably comprises a differential amplifier with its negative terminal connected to buffer output on line 29 and its positive terminal connected to buffer output on line 30. Comparator 32 further comprises a diode, the anode of which is connected to the output of the differential amplifier. A capacitor and resistor are connected in parallel between the cathode of the diode and ground. The voltage across the capacitor forms the output, on line 33, of comparator 32 and this output is connected to the control input 34 of gain control circuit 36. Connected to buffer output on line 29 is a bias control circuit 38 which biases the output on line 29 higher than the output on line 30 for a low or absent input signal.

In operation, the audio input signal on line 12 is buffered and provided, through detector 16 to peak filter 18. The peak filter capacitor charges to a value proportional to the peak level of the signal at its input on line 17. The value of the discharge resistor, which shunts the filter capacitor, is sufficiently large to allow very fast charging of the capacitor. The peak filter output, which is the voltage across its capacitor, is buffered and input to the negative terminal of the differential amplifier in comparator 32.

Similarly, the buffered audio input signal is sent to an average filter through an amplifier 22 and a detector 24. The filter capacitor of average filter 26 charges to a level proportional to the average level of signal at its input on line 25. The series resistor preceding the filter capacitor limits current and creates a voltage drop, thereby preventing filter capacitor from charging to a level proportional to the peak of the signal on line 25. The output signal of the average filter, which is voltage developed across the average filter capacitor, is buffered and sent to the positive terminal of the differential amplifier.

Since a tone has a sinusoidal waveform, the peak-to-average ratio of a tone signal is constant and low. Conversely, for a typical voice signal, the average level is significantly less than the peak level. Therefore, voice signals tend to have high peak-to-average ratios. Amplifier 22 provides gain to the signal supplied to the average filter 26. The value of gain supplied by amplifier 22 is based on the respective peak-to-average ratios of voice and tone signals. The gain is set to a value greater than the peak-to-average ratio of a sinusoidal tone signal (typically 1.41) but less than the peak-to-average ratio of a typical voice signal. Because of this gain setting, the output of the average filter is slightly greater than the output of the peak filter for a tone signal but slightly less than the output of the peak filter for a voice signal.

The differential amplifier compares the two signals on lines 29 and 30 and generates one of two outputs. When a voice signal is present on the audio input 12, the signal on line 29 is greater than the signal on line 30, causing the output of the differential amplifier to become negative. The diode connected to the differential amplifier output is therefore reverse biased, and does not conduct. This leaves the capacitor of the comparator uncharged and thus provides a logical "0" at the comparator output, which is then applied to control input 34. Conversely, when a tone is present on input 12, the signal on line 30 is greater than the signal on line 29, causing the output of the differential amplifier to become positive. The diode is therefore forward biased and conducts, thereby allowing the capacitor to charge. The voltage across this capacitor is the output, on line 33, of comparator 32 and is applied to control input 34.

Control input 34 controls the attenuation of gain control circuit 36. The capacitor charges when a tone is applied to the audio input, and its voltage is applied to control input 34. This voltage at the control input 34 signals gain control circuit 36 that a tone is present and that attenuation is to be applied accordingly provided the peak signal level of the tone exceeds a certain predetermined threshold. The attenuation applied to the tone signal by the gain control circuit 36 is thus controlled by the charged capacitor, which charges when the output of the average filter exceeds the output of the peak filter. Therefore, the level of the average signal controls the charging of the capacitor, and thus, the attenuation of tone signals. Conversely, the capacitor remains uncharged when a voice signal is present at the audio input. This lack of voltage at the control input 34 causes gain control circuit 36 to determine that a voice is present and that the gain control circuit should not increase the attenuation beyond that which it normally applies to the input signal based on the peak signal level.

Preferably, the attenuation of gain control circuit 36 is applied in two distinct levels. The level of attenuation applied by gain control circuit 36 is controlled by the signal at the control input 34 of the gain control circuit 36. A first level of attenuation is applied by gain control circuit 36 when the input signal is a voice signal, as determined by the logical "0" signal (uncharged capacitor) applied to the control input 34. A second, increased level of attenuation is applied by gain control circuit 36 when the input signal is a tone, as determined by the logical "1" signal (charged capacitor) applied to the control input 34. The methods employed to control the gain applied by gain control circuit 36 are well known in the art and many different methods will suffice. The preferred embodiment utilizes an FET type switch for varying the amount of feedback resistance in an amplifier to control the gain.

Bias control circuit 38 prevents the gain control circuit from increasing the attenuation of the input signal 12 when the input signal is very low or absent. Bias control circuit 38 biases the buffer output on line 29 higher than the buffer output on line 30 for these no or low signal conditions. This causes comparator to output a logical "0" and, as described above, does not trigger gain control circuit 36 to increase the attenuation of the input signal.

It is believed that the best mode of practicing the present invention is one in which most of the components of the circuit are fabricated on an integrated circuit although it is recognized that several of the timing capacitors described herein would probably need to be external devices. The present inventor does not claim to have the necessary expertise to fabricate, or supervise the fabrication of such a circuit but believes that it is within the level of ordinary skill in the art of semiconductor circuit fabrication.

An alternative embodiment of the present invention is shown in the circuit of FIG. 2. This circuit 11 is similar to the circuit of FIG. 1 in both topology and operation with the exception being the absence of comparator 32 and its accompanying bias control circuit 38. In the alternative embodiment of FIG. 2, the buffer outputs, on lines 29 and 30, are not applied to a comparator, but instead are connected to effectively form a hardwired OR. Outputs of buffers 20 and 28, on lines 29 and 30, respectively, are connected to form a signal on line 31, which is then connected directly to control input 34 of gain control circuit 36. Additionally, buffers 20 and 28 preferably comprise electronic half-wave rectifiers.

In operation, the circuit of FIG. 2 performs similarly to the circuit of FIG. 1. Peak filter 18 produces an output proportional to the peak level of the signal provided to its input on line 17 and average filter 26 produces an output proportional to the average level of the signal provided to its input on line 25. The value of the gain of amplifier 22 is based on the respective peak-to-average ratios of voice and tone signals. The gain is set to a value greater than the peak-to-average ratio of a sinusoidal tone signal (typically 1.41) but less than the peak-to-average ratio of a typical voice signal. Because of this gain setting, the output of the average filter is greater than the output of the peak filter for a tone signal but less than the output of the peak filter for a typical voice signal.

The outputs of filters 18 and 26 are connected to buffers 20 and 28, respectively. The outputs, on lines 29 and 30, of buffers 20 and 28, respectively, are directly connected to form the signal on line 31 instead of being input to a comparator. The signal on line 31 is input to gain control circuit 36 via control input 34, where the larger of the signals on lines 29 and 30 controls the attenuation function of the circuit 36. The direct connection of outputs on lines 29 and 30 effectively form a hardwired OR, where the larger of the two outputs control the signal on line 31 applied to control input 34. Integrated circuit analog amplifiers of this type, i.e., amplifiers that can have their output stages tied together such that the output signal is the larger of the two individual outputs, are well known to those skilled in the art.

When a tone is present on the audio input signal line 12, the output of the average filter is greater than the output of the peak filter, and, therefore, the signal on line 30 is greater than the signal on line 29. In this case, the signal on line 30 controls and the control input will cause the gain control circuit to increase the attenuation applied to the audio input signal 12 before it is output to the headset on line 37. When voice is present on the audio input signal line 12, the output of the average filter is less than the output of the peak filter and, therefore, the signal on line 30 is less than the signal on line 29. In this case, the signal on line 29 controls and the control input will cause the gain control circuit to attenuate the signal based only on the peak signal level of the audio input signal 12. Therefore, the average signal controls attenuation of tones and the peak signal controls attenuation of voice signals.

A further circuit for effecting attenuation of tones is shown in FIG. 3. This circuit, generally shown at 13, is designed as add-on circuitry for existing, peak limiting AGC circuits.

The audio input signal on line 12 is input to an automatic gain control circuit 40, which varies the gain applied to the input signal in response to the peak level of the signal on line 12. Because this invented circuit is designed to be added to existing AGC circuitry, the AGC 40 is not an element of the present invention per se. The output, on line 41, of AGC 40 is input to the invented tone attenuator circuit 13.

The signal on line 12 is processed by AGC 40 based solely on the peak level of the signal. AGC 40 outputs a signal, on line 41, having peak levels that do not exceed a predetermined level set by AGC 40. The input stage 14, which comprises a buffer, accepts the output on line 41 from the previous stage, peak limiting AGC 40. The buffer of the input stage is preferably an operational amplifier with the output connected to its negative input terminal, as is well known in the art. The output of buffer 14, on line 15, is input to gain control circuit 36 for possible further attenuation of the signal. The control input 34 to gain control circuit 36 controls the attenuation provided by the circuit.

The output of buffer 14, on line 15, is also provided to the input of detector 24, which preferably comprises a diode. The output of detector 24 is input to average filter 26, which generates a signal proportional to the average level of the signal supplied to its input on line 25. Average filter 26 preferably includes a series resistor with a filter capacitor and a discharge resistor connected between the output of the series resistor and ground. The values of the series resistor and the filter capacitor are set to provide a time constant of from 0.1 to 0.4 seconds. The output of average filter 26, on line 27, is applied to a threshold compare circuit 42. This circuit 42 preferably comprises a differential amplifier, the positive input terminal of which is connected to the output of average filter 26 on line 27 and the negative input terminal of which is connected to a source of a predetermined threshold voltage, such as the wiper of a potentiometer. This predetermined threshold voltage is set to a value dependent on the maximum peak level of the signals output on line 41 from peak limiting AGC 40. The threshold voltage is set to be higher than the output of average filter 26 for a voice input signal, but less than the output of average filter 26 for a tone input signal when these input signals have peak levels equal to the maximum peak level allowed by AGC 40. Threshold compare circuit 42 further comprises a diode, the anode of which is connected to the output of the differential amplifier. The cathode of the diode forms the output of threshold compare circuit 42.

The output of the threshold compare circuit 42 is connected to the input of a filter 44. The filter preferably comprises a feed resistor connected in series with the diode of circuit 42 and a filter capacitor and discharge resistor connected in parallel between the output terminal of the feed resistor and ground. The feed resistor and filter capacitor preferably have values that give the network a short charging time constant so that gain is not attenuated falsely by the gain control circuit 36. The voltage across the capacitor comprises the output, on line 45, of filter 44, and is applied to control input 34 of gain control circuit 36.

In operation, the audio input signal on line 12 is applied to AGC 40, which is responsive to the peak level of the input signal. AGC 40 operates to clamp the output on line 37 to a maximum peak level when the peak level of the input signal on line 12 exceeds a predetermined level. The buffered output, on line 15, of the AGC output on line 41, is applied to gain control circuit 36. Buffer output on line 15 is also applied to average filter 26 through detector 24. The filter capacitor of average filter 26 charges to a level proportional to the average level of the signal on line 25. The series resistor preceding the filter capacitor limits current and creates a voltage drop, thereby preventing the filter capacitor from charging to a level proportional to the peak of the signal on line 25. The output signal of the average filter, on line 27, which is the voltage developed across the average filter capacitor, is then input to a threshold compare circuit 42, where it is compared to a predetermined threshold voltage.

The differential amplifier compares the output of the average filter on line 27 with the predetermined threshold voltage. The threshold voltage is set to a level greater than the output of average filter 26 for voice but less than the output of average filter 26 for tones when the voice and tone signals input to the average filter on line 25 have peak levels equal to the maximum peak signal level allowed by AGC 40. Therefore, the threshold voltage, set to a value between the average filter output for voice and tones, is proportional to, and dependent on, the maximum peak level of the output of AGC 40 on line 41.

The differential amplifier thus compares two signals, one signal on line 27 being proportional to the average level of the signal at the AGC output on line 41, and the other signal having a threshold voltage set at a level between the average levels of tone and voice signals present on AGC output line 41. Because voice signals have a high peak-to-average ratio, and tones have a constant and low peak-to-average ratio, the level of the average signal can be used to determine the presence of a tone when the peak level of the signals is held nearly constant. The threshold compare circuit 42 determines that a tone is present when the average signal on line 27 exceeds the threshold. When this occurs, the differential amplifier of the threshold compare circuit 42 generates a positive output. A diode, the anode of which is connected to the differential amplifier output, is then forward biased, and passes the output to filter 44. When the average signal on line 27 is less than the threshold voltage, the differential amplifier generates a negative output, which reverse biases the diode, preventing current flow from the output of the amplifier.

When a voice signal is present on the audio input line 12, the differential amplifier has a negative output and the diode does not conduct. This leaves the capacitor of the filter 44 uncharged and thus provides a logical "0" at the filter output on line 45, which is then applied to control input 34. Conversely, when a tone is present on input line 12, the output of the average filter on line 27 is greater than the predetermined threshold voltage, causing the output of the differential amplifier to become positive. The diode is therefore forward biased and conducts, passing current to the filter capacitor of filter 44, allowing it to charge. The voltage across this capacitor comprises the output signal, on line 45, of filter 44 and is applied to control input 34.

Control input 34 controls the attenuation applied by gain control circuit 36. The capacitor charges when a tone is applied to the audio input, and its voltage is applied to control input 34. This voltage at the control input 34 signals gain control circuit 36 that a tone is present and that additional attenuation is to be applied accordingly. The attenuation applied to the tone signal by the gain control circuit 36 is thus controlled by the charged capacitor, which charges when the output of the average filter exceeds the threshold. Therefore, the level of the average signal controls the attenuation of tone signals. Conversely, the capacitor remains uncharged when a voice signal is present at the audio input. This lack of voltage at the control input 34 signals gain control circuit 36 that a voice is present and that the gain control circuit should not increase the attenuation. The methods employed to control the gain applied by gain control circuit 36 are well known in the art and many different methods will suffice. Preferably an FET type switch will be used for varying the amount of feedback resistance in an amplifier to control the gain.

FIG. 4 graphically demonstrates the operation of the circuit shown in FIG. 3. FIG. 4 plots the output peak voltage on line 37 (Vout peak), against the input peak voltage on line 12 (Vin peak). FIG. 4 shows that the output peak voltage on line 37 is limited to a maximum level "B" when the input voltage on line 12 exceeds a level "D". This peak limiting is controlled by peak limiting AGC 40. For input peak voltages below "D", the peak limiting AGC 40 has an approximately linear gain characteristic.

However, typical AGCs, such as that shown at 40, operate to attenuate signals based only on their peak signal levels. These AGCs cannot determine when a tone is present. The add-on circuitry of the present invention operates to detect when a tone is present at audio input line 12 and to further attenuate the signals in response thereto. As discussed above, a tone is detected by first generating a signal proportional to the average level of the signal at the output of the AGC 40 on line 41. This signal, on line 27, is compared to a threshold voltage.

The threshold voltage is dependent on the peak level of the maximum peak signal level of the output of the AGC 40. As shown in FIG. 4, this maximum output peak level is "B", and clamping occurs for any input voltage exceeding "D". Therefore, the threshold is set to a level greater than the average level of a typical voice signal on line 41 having a peak level of "B" but lower than the average level of a tone signal on line 41 having a peak level of "B". Because the average level of a pure sinusoidal tone is approximately 0.707 of the peak signal level, the threshold voltage will be set lower than 0.707 of the maximum peak signal level on AGC output line 41. As an example, FIG. 4 denotes the peak signal level on AGC output line 41 as "B". Therefore, the threshold voltage will be set to a level less than (0.707)(B), but greater than the average level of a typical voice signal having a peak level of "B".

Thus, when the input signal is a tone having an input peak level of "D", the peak level of the signal at AGC output line 41 is "B", and the output of the average filter will exceed the threshold voltage. When this occurs, the control input 34 forces the gain control circuit 36 to further attenuate the input signal such that the output signal on line 37 is limited to a maximum peak level "A".

Therefore, it can be seen from FIG. 4 that when the input signal level exceeds "C" and the average signal level exceeds the threshold level, gain control circuit 36 is activated to further attenuate the signal to clamp the output on line 37 to a maximum level "A". When the input signal is a voice signal, the output of the average filter will not exceed the threshold voltage, and the gain control circuit 36 will not operate to increase attenuation of the signal. Thus, attenuation of voice signals is governed strictly by AGC 40, and will be limited to a peak level "B".

The value of peak level "A" is chosen such that the average level of a tone having a peak level "A" is nearly equal to the average level of a voice signal having a peak level of "B". Therefore, the circuit operates to provide output signals to a user's headset on line 37 that are nearly constant in terms of average signal level. Because humans equate loudness with the average level of audio signals, the perceived loudness of tones is equal to that of voice signals.

From the foregoing it will be appreciated that the disclosed embodiments of the present invention overcome the drawbacks of the prior art described hereinabove and accomplish the previously stated objects of the present invention. From the description of the alternate preferred embodiments, equivalents of the elements shown therein will suggest themselves to those skilled in the art and way of constructing other embodiments of the present invention will suggest themselves to practitioners of the art. Therefore, the scope of the present invention is to be limited only by the claims below and equivalents thereof.

What is claimed is:

1. A tone attenuator circuit, comprising:

first means for generating a peak signal proportional to the peak level of an input signal;

second means for generating an average signal proportional to the average level of the input signal; and gain control means connected to said first and second means for varying the gain applied to the input signal;

wherein said gain control means is responsive to said peak signal and said average signal to vary the gain when said input signal is a tone, said input signal being said tone when said average signal reaches a predetermined level relative to said peak signal.

2. A method of attenuating a tone, comprising the steps of:

generating a peak signal proportional to the peak level of an input signal;

generating an average signal proportional to the average level of said input signal;

comparing said peak signal and said average signal; and determining when said input signal is a tone when said average signal reaches a predetermined level relative to said peak signal; and; attenuating said input signal when said input signal is said tone.

3. A circuit for attenuating tones including a first automatic gain control circuit (AGC) operating to attenuate an input signal responsive only to the peak level of the input signal, wherein the improvement comprises:

an input stage connected to said first AGC, wherein said input stage comprises a buffer;

a second gain control circuit having an input connected to said input stage and an output for providing an output signal, and a control input for accepting a control signal for varying the gain applied by said second gain control circuit;

a detector having an input connected to said input stage, wherein said detector comprises a diode;

an average filter having an input connected to said detector for providing a signal proportional to the average level of the signal applied to its input, wherein said average filter comprises:

a first resistor, the first terminal of which is connected to said detector; and a second resistor and a capacitor, each being connected between the second terminal of said first resistor and a ground point;

a threshold compare circuit having an input connected to said average filter for comparing the signal at the output of said average filter to a predetermined signal level, wherein said threshold compare circuit comprises a differential amplifier with one input connected to said average filter and a second input connected to a line with a predetermined voltage, and a diode connected to the output of said differential amplifier, wherein said predetermined signal level of said threshold compare circuit is proportional to the output of the first AGC, and wherein said threshold compare circuit provides an output signal having a first value when the output of said average filter is greater than said predetermined level and having a second value when the output of said average filter is not greater than said predetermined level;

a second filter with an input connected to the output of said threshold compare circuit and an output connected to said control input of said second gain control circuit, wherein said second filter comprises:

a first resistor, the first terminal of which is connected to said output of said threshold compare circuit; and a second resistor and a capacitor, each being connected between the second terminal of said first resistor and a ground point;

said control input of said second gain control circuit being connected to the output of said second filter, said control input causing said second gain control circuit to increase attenuation of the signal applied to its input when the output of said threshold compare circuit is said first value and to not increase attenuation of the signal when the output of said threshold compare circuit is said second value.

4. A tone attenuator circuit, comprising:

an input stage for accepting an input signal, wherein said input stage comprises a buffer;

a gain control circuit having an input for accepting the input signal and an output for providing an output signal, and a control input for accepting a control signal for varying the gain applied by said gain control circuit in response to said control signal;

a first detector having an input connected to said input stage, wherein said first detector comprises a diode;

a peak filter having an input connected to said first detector for providing a signal proportional to the peak value of said input signal, wherein said peak filter comprises a capacitor and a resistor, each being connected between the output of said first detector and a ground point;

a first buffer having an input connected to said peak filter, wherein said first buffer comprises a half-wave rectifier;

an amplifier having an input connected to said input stage;

a second detector having an input connected to said amplifier, wherein said second detector comprises a diode;

an average filter having an input connected to said second detector for providing a signal proportional to the average value of said input signal, wherein said average filter comprises a first resistor, the first terminal of which is connected to the output of said second detector and a capacitor and a second resistor, each being connected between the second terminal of said first resistor and a ground point;

wherein the gain of said amplifier is such that the output of said average after is less than the output of said peak filter when the input signal is voice and the output of said average filter is greater than the output of said peak filter when the input signal is a tone;

a second buffer having an input connected to said average filter, wherein said second buffer comprises a half-wave rectifier;

said control input of said gain control circuit being connected to the outputs of said first and second buffers, and causing said gain control circuit to increase attenuation of the input signal when the output of said second buffer is greater than the output of said first buffer and to not increase attenuation of the input signal when the output of said second buffer is not greater than the output of said first buffer.

5. A tone attenuator circuit, comprising:

an input stage for accepting an input signal;

a gain control circuit having an input for accepting the input signal and an output for providing an output signal, and a control input for accepting a control signal for varying the gain applied by said gain control circuit in response to said control signal;

a first detector having an input connected to said input stage;

a peak filter having an input connected to said first detector for providing a signal proportional to the peak value of said input signal;

an amplifier having an input connected to said input stage;

a second detector having an input connected to said amplifier;

an average filter having an input connected to the output of said second detector for providing a signal proportional to the average value of said input signal; and a comparator, the first and second inputs of which are connected to the outputs of said peak filter and said average filter, respectively, and the output of which is connected to said control input, for generating said control signal in response to the relative levels of the signals at its inputs;

wherein said gain of said amplifier is such that said output of said average filter is less than said output of said peak filter when said input signal is voice and said output of said average filter is greater than said output of said peak filter when said input signal is said tone.

6. The tone attenuator circuit of claim 5 wherein said input stage comprises a buffer.

7. The tone attenuator circuit of claim 5 wherein each said detector comprises a diode.

8. The tone attenuator circuit of claim 5 wherein said peak filter comprises a capacitor and a resistor, each being connected between the output of said first detector and a ground point.

9. The tone attenuator circuit of claim 5 wherein said average filter comprises:

a first resistor, the first terminal of which is connected to the output of said second detector; and a capacitor and a second resistor, each connected between the second terminal of said first resistor and a ground point.

10. The tone attenuator circuit of claim 5 wherein said comparator comprises a differential amplifier.

11. The tone attenuator circuit of claim 10 wherein the output of said differential amplifier is connected to a diode.

12. The tone attenuator circuit of claim 11 further comprising a capacitor and a resistor, each being connected between the output of said diode and a ground point.

13. The tone attenuator circuit of claim 12 wherein the output of said diode is connected to said control input.

14. The tone attenuator circuit of claim 5, further comprising:

a first buffer connected between said output of said peak filter and said first input of said comparator;

a second buffer connected between said output of said average filter and said second input of said comparator;

wherein each said first and second buffer comprises a half-wave rectifier.

15. The tone attenuator circuit of claim 14 wherein the output of said first buffer is biased higher than the output of said second buffer so that said comparator will not generate an output that will cause said gain control circuit to attenuate the signal at its input when the input signal is low or absent.

16. The tone attenuator circuit of claim 5 wherein said comparator generates an output signal having a first value when the output of said average filter is greater than the output of said peak filter and having a second value when the output of said average filter is not greater than the output of said peak filter.

17. The tone attenuator circuit of claim 16 wherein said gain control circuit attenuates the input signal more when the output of said comparator is said first value and attenuates the input signal less when the output of said comparator is said second value.

18. A tone attenuator circuit, comprising:

an input stage for accepting an input signal, wherein said input stage comprises a buffer;

a gain control circuit having an input for accepting the input signal and an output for providing an output signal, and a control input for accepting a control signal for varying the gain applied by said gain control circuit in response to said control signal;

a first detector having an input connected to said input stage, wherein said first detector comprises a diode;

a peak filter having an input connected to said first detector for providing a signal proportional to the peak value of said input signal, wherein said peak filter comprises a capacitor and a resistor, each being connected between the output of said first detector and a ground point;

a first buffer having an input connected to said peak filter, wherein said first buffer comprises a half-wave rectifier;

an amplifier having an input connected to said input stage;

a second detector having an input connected said amplifier, wherein said second detector comprises a diode;

an average filter having an input connected said second detector for providing a signal proportional to the average value of said input signal, wherein said average filter comprises a first resistor the first terminal of which is connected to the output of said second detector and a capacitor and a second resistor, each being connected between the second terminal of said first resistor and a ground point;

wherein the gain of said amplifier is such that the output of said average filter is less than the output of said peak filter when the input signal is voice and the output of said average filter is greater than the output of said peak filter when the input signal is a tone;

a second buffer having an input connected to said average filter means, wherein said second buffer comprises a half-wave rectifier;

a comparator, the inputs of which are connected to said first and second buffers, and the output of which is connected to said control input, for generating an output having a first value when the output of said average filter is greater than the output of said peak filter and a second value when the output of said average filter is not greater than the output of said peak filter, said comparator comprising a differential amplifier, the output of which is connected to a diode, and further comprising a capacitor and a resistor, each being connected between the output of said diode and a ground point.

19. A tone attenuator circuit, comprising:

an input stage for accepting an input signal;

a gain control circuit having an input for accepting the input signal and an output for providing an output signal, and a control input for accepting a control signal for varying the gain applied by said gain control circuit in response to said control signal;

a first detector having an input connected to said input stage;

a peak filter having an input connected to said first detector for providing a signal proportional to the peak value of said input signal;

a first buffer having an input connected to said peak filter;

an amplifier having an input connected to said input stage;

a second detector having an input connected to said amplifier;

an average filter having an input connected to said second detector for generating a signal proportional to the average value of said input signal;

a second buffer having an input connected to said average filter;

said control input of said gain control circuit being connected to the outputs of said first and second buffers, and causing said gain control circuit to vary the gain applied to the input signal in response to said buffer outputs.

20. The tone attenuator circuit of claim 19 wherein said input stage comprises a buffer.

21. The tone attenuator circuit of claim 19 wherein each said detector comprises a diode.

22. The tone attenuator circuit of claim 19 wherein said peak filter comprises a capacitor and a resistor, each being connected between the output of said first detector and a ground point.

23. The tone attenuator circuit of claim 19 wherein each said first and second buffer comprises a half-wave rectifier.

24. The tone attenuator circuit of claim 19 wherein the gain of said amplifier is such that the output of said average filter is less than the output of said peak filter when the input signal is voice and the output of said average filter is greater than the output of said peak filter when the input signal is a tone.

25. The tone attenuator circuit of claim 19 wherein said average filter comprises:

a first resistor, the first terminal of which is connected to the output of said second detector; and a capacitor and a second resistor, each being connected between the second terminal of said first resistor and a ground point.

26. The tone attenuator circuit of claim 19 wherein said gain control circuit increases the attenuation of the input signal when the output of said second buffer is greater than the output of said first buffer and does not increase the attenuation of the input signal when the output of said second buffer is not greater than the output of said first buffer.

27. An improved circuit, for attenuating tones, designed for connection to a first automatic gain control circuit (AGC) operating to attenuate an input signal responsive only to the peak level of the input signal, wherein the improvement comprises:

an input stage connected to said first AGC;

a second gain control circuit having an input connected to said input stage and an output for providing an output signal, and a control input for accepting a control signal for varying the gain applied by said second gain control circuit;

a detector having an input connected to said input stage;

an average filter having an input connected to said detector for providing a signal proportional to the average level of the signal applied to its input;

a threshold compare circuit having an input connected to said average filter for comparing the signal at the output of said average filter to a predetermined signal level;

a second filter with an input connected to the output of said threshold compare circuit and an output connected to said control input of said second gain control circuit;

said control input of said second gain control circuit being connected to the output of said second filter, said control input causing said second gain control circuit to attenuate the signal applied to its input in response to the output of said second filter.

28. The circuit of claim 27 wherein said input stage comprises a buffer.

29. The circuit of claim 27 wherein said detector comprises a diode.

30. The circuit of claim 27 wherein said average filter comprises:

a first resistor, the first terminal of which is connected to the output of said detector; and a second resistor and a capacitor, each being connected between the second terminal of said first resistor and a ground point.

31. The circuit of claim 27 wherein said threshold compare circuit comprises a differential amplifier with one input connected to the output of said average filter and a second input connected to a line with a predetermined signal level.

32. The circuit of claim 31 wherein said threshold compare circuit further comprises a diode connected to the output of said differential amplifier.

33. The circuit of claim 27 wherein said predetermined signal level of said threshold compare circuit is proportional to the output of said first AGC.

34. The circuit of claim 33 wherein said predetermined signal level is less than about 0.707 times the peak level of signal at the output of said first AGC.

35. The circuit of claim 27 wherein said second filter comprises:

a first resistor, the first terminal of which is connected to the output of said threshold compare circuit; and a second resistor and a capacitor, each being connected between the second terminal of said first resistor and a ground point.

36. The circuit of claim 27 wherein said threshold compare circuit generates an output signal having a first value when the output of said average filter is greater than said predetermined signal level and having a second value when the output of said average filter is not greater than said predetermined signal level.

37. The circuit of claim 36 wherein said second gain control circuit increases attenuation of the signal applied to its input when the output of said threshold compare circuit is said first value and does not increase attenuation of the signal when the output of said threshold compare circuit is said second value.

* * * * *